United States Patent
Hattori et al.

(10) Patent No.: US 10,892,418 B2
(45) Date of Patent: Jan. 12, 2021

(54) CHARGE INJECTION LAYER AND METHOD FOR ITS PRODUCTION AS WELL AS ORGANIC PHOTOELECTRONIC ELEMENT AND METHOD FOR ITS PRODUCTION

(71) Applicants: AGC Inc., Chiyoda-ku (JP); National University Corporation Yamagata University, Yamagata (JP)

(72) Inventors: Shigeki Hattori, Chiyoda-ku (JP); Takefumi Abe, Chiyoda-ku (JP); Kaori Tsuruoka, Chiyoda-ku (JP); Yasuhiro Kuwana, Chiyoda-ku (JP); Daisuke Yokoyama, Yonezawa (JP)

(73) Assignees: AGC Inc., Chiyoda-ku (JP); National University Corporation Yamagata University, Yamagata (JP)

(*) Notice: Subject to any disclaimer, the term of this patent is extended or adjusted under 35 U.S.C. 154(b) by 0 days.

(21) Appl. No.: 16/779,732

(22) Filed: Feb. 3, 2020

(65) Prior Publication Data
US 2020/0176678 A1 Jun. 4, 2020

Related U.S. Application Data

(63) Continuation of application No. PCT/JP2018/031237, filed on Aug. 23, 2018.

(30) Foreign Application Priority Data

Aug. 24, 2017 (JP) ................................. 2017-161640

(51) Int. Cl.
*H01L 51/50* (2006.01)
*H01L 51/00* (2006.01)
*H01L 51/56* (2006.01)

(52) U.S. Cl.
CPC .......... *H01L 51/004* (2013.01); *H01L 51/001* (2013.01); *H01L 51/5056* (2013.01);
(Continued)

(58) Field of Classification Search
None
See application file for complete search history.

(56) References Cited

U.S. PATENT DOCUMENTS

2016/0035995 A1* 2/2016 Lee ..................... H01L 51/5206
257/40
2017/0369727 A1 12/2017 De Campo et al.
(Continued)

FOREIGN PATENT DOCUMENTS

JP 2006-237083 A 9/2006
JP 2010-21422 A 1/2010
(Continued)

OTHER PUBLICATIONS

International Search Report dated Nov. 27, 2018 in PCT/JP2018/031237 filed Aug. 23, 2018, 2 pages.

*Primary Examiner* — Benjamin P Sandvik
(74) *Attorney, Agent, or Firm* — Oblon, McClelland, Maier & Neustadt, L.L.P.

(57) ABSTRACT

To provide a charge injection layer in which the refractive index is sufficiently low and unbalance in the composition of materials is less likely to occur, and a method for its production as well as an organic photoelectronic element and a method for its production. The charge injection layer contains a fluorinated polymer and a semiconductor material, and has a refractive index in the wavelength range of from 450 to 800 nm, of at most 1.60.

21 Claims, 3 Drawing Sheets

(52) U.S. Cl.
CPC ...... *H01L 51/5072* (2013.01); *H01L 51/5088* (2013.01); *H01L 51/5092* (2013.01); *H01L 51/56* (2013.01); *H01L 2251/558* (2013.01)

(56) References Cited

U.S. PATENT DOCUMENTS

| | | | | |
|---|---|---|---|---|
| 2018/0340033 A1* | 11/2018 | Price | ........................ | C08L 27/22 |
| 2019/0288205 A1* | 9/2019 | Abe | ........................ | H01L 51/50 |
| 2019/0305226 A1* | 10/2019 | Yokoyama | .............. | H01L 51/50 |
| 2020/0168829 A1* | 5/2020 | Hattori | ................ | C08F 114/185 |

FOREIGN PATENT DOCUMENTS

| | | |
|---|---|---|
| WO | WO 2013/108618 A1 | 7/2013 |
| WO | WO 2015/029203 A1 | 3/2015 |
| WO | WO 2016/100313 A1 | 6/2016 |
| WO | WO 2016/204275 A1 | 12/2016 |

* cited by examiner

Top emission type Primary resonance construction

HIL film thickness [nm]

CHARGE INJECTION LAYER AND METHOD FOR ITS PRODUCTION AS WELL AS ORGANIC PHOTOELECTRONIC ELEMENT AND METHOD FOR ITS PRODUCTION

TECHNICAL FIELD

The present invention relates to a charge injection layer and a method for its production, as well as an organic photoelectronic element and a method for its production.

BACKGROUND ART

Heretofore, the internal quantum efficiency of an organic electroluminescent element (organic EL element) has reached nearly 100%. On the other hand, the light extraction efficiency relating to the external quantum efficiency remains to be only about from 20 to 30% and thus is required to be improved. One of the causes for lowering the light extraction efficiency may be that part of the light generated in the light emitting layer positioned between two electrodes, will be lost in the element due to e.g. reflection in the element, surface plasmon, optical waves, etc. The essential cause for loss of light is that the refractive index of the semiconductor material constituting the light emitting layer, etc. between the two electrodes, is high.

Patent Document 1 discloses a technique for reducing the refractive index of a charge transport layer by incorporating nano-sized porous silica particles in the charge transport layer.

PRIOR ART DOCUMENT

Patent Document

Patent Document 1: WO2013/108618

DISCLOSURE OF INVENTION

Technical Problem

However, in the process for producing a charge transport layer as described in Patent Document 1, it is necessary to form a film by uniformly dispersing nano-sized porous silica particles in the material composition. Since difficulty is high in this dispersion technique, there is a concern that deviation occurs in the distribution of the particles in the charge transport layer.

The present invention is to provide a charge injection layer, of which the refractive index is sufficiently low, and in which deviation in the composition of the material is unlikely to occur, and a method for its production, as well as an organic photoelectronic element and a method its production.

Solution to Problem

[1] A charge injection layer containing a fluorinated polymer and a semiconductor material, and having a refractive index in the wavelength range of from 450 nm to 800 nm, of at most 1.60.
[2] The charge injection layer according to [1], wherein the volume ratio represented by (the content of the fluorinated polymer):(the content of the semiconductor material) is from 70:30 to 5:95.
[3] The charge injection layer according to [1] or [2], which contains a dopant.
[4] The charge injection layer according to [3], wherein the content proportion of the fluorinated polymer is from 30 to 70 vol %, to the total of the fluorinated polymer, the semiconductor material and the dopant.
[5] The charge injection layer according to [3] or [4], wherein the content proportion of the dopant is from 10 to 200 parts by mol to 100 parts by mol of the entire mass of the semiconductor material.
[6] The charge injection layer according to any one of [1] to [5], wherein the charge injection layer is a physical vapor deposition layer.
[7] The charge injection layer according to any one of [1] to [6], wherein the refractive index in the wavelength range of from 450 nm to 800 nm, of the fluorinated polymer, is at most 1.5.
[8] The charge injection layer according to any one of [1] to [7], wherein the evaporation rate at 300° C. in a vacuum degree of at most $1 \times 10^{-3}$ Pa, of the fluorinated polymer, is at least 0.01 g/m²sec.
[9] The charge injection layer according to any one of [1] to [8], wherein the fluorinated polymer is a polymer which does not have an aliphatic ring and has units derived from a fluoroolefin, in the main chain, or a polymer which has an aliphatic ring structure in the main chain.
[10] The charge injection layer according to any one of [1] to [9], wherein the fluorinated polymer is a perfluoropolymer having an aliphatic ring structure in the main chain.
[11] The charge injection layer according to any one of [1] to [10], wherein the weight average molecular weight of the fluorinated polymer is from 1,500 to 50,000.
[12] An organic photoelectronic element comprising an anode, a cathode provided to face the anode, a light emitting layer provided between the anode and the cathode, and a hole injection layer provided on the light emitting layer side of the anode, wherein the hole injection layer is a charge injection layer as defined in any one of [1] to [11].
[13] The organic photoelectronic element according to [12], which is provided with a hole transport layer between the light emitting layer and the hole injection layer, and the ratio of the thickness of the hole injection layer to the thickness of the hole transport layer is from 1:2 to 30:1.
[14] An organic photoelectronic element comprising an anode, a cathode provided to face the anode, a light emitting layer provided between the anode and the cathode, and an electron injection layer provided on the light emitting layer side of the cathode, wherein the electron injection layer is a charge injection layer as defined in any one of [1] to [11].
[15] The organic photoelectronic element according to [14], which is provided with an electron transport layer between the light emitting layer and the electron injection layer, and the ratio of the thickness of the electron injection layer to the thickness of the electron transport layer is from 1:2 to 30:1.
[16] The organic photoelectronic element according to any one of [12] to [15], wherein the perfluoropolymer is polyperfluoro(3-butenyl vinyl ether).
[17] The organic photoelectronic element according to [16], wherein the intrinsic viscosity of the polyperfluoro(3-butenyl vinyl ether) is from 0.01 to 0.14 dl/g.
[18] A method for producing a charge injection layer as defined in any one of [1] to [11], which comprises a step of co-vapor depositing the fluorinated polymer and the semiconductor material on the anode or cathode.
[19] A method for producing a charge injection layer as defined in any one of [1] to [11], which comprises a step of applying a liquid composition comprising the fluorinated polymer and the semiconductor material, on the anode or cathode.

[20] A method for producing an organic photoelectronic element as defined in any one of [12] to [17], which comprises a step of forming a charge injection layer by the method as defined in [18] or [19].

Advantageous Effects of Invention

The charge injection layer of the present invention has a sufficiently low refractive index and has a uniform material composition.

According to the method for producing a charge injection layer of the present invention, it is possible to produce the above excellent charge injection layer in good yield.

The organic photoelectronic element of the present invention is provided with the charge injection layer at a position in contact with an electrode. By this construction, the organic photoelectronic element of the present invention exhibits a high light extraction efficiency.

According to the method for producing an organic photoelectronic element of the present invention, it is possible to produce the above excellent organic photoelectronic element in good yield.

DESCRIPTION OF EMBODIMENTS

Charge Injection Layer

Figure 1:
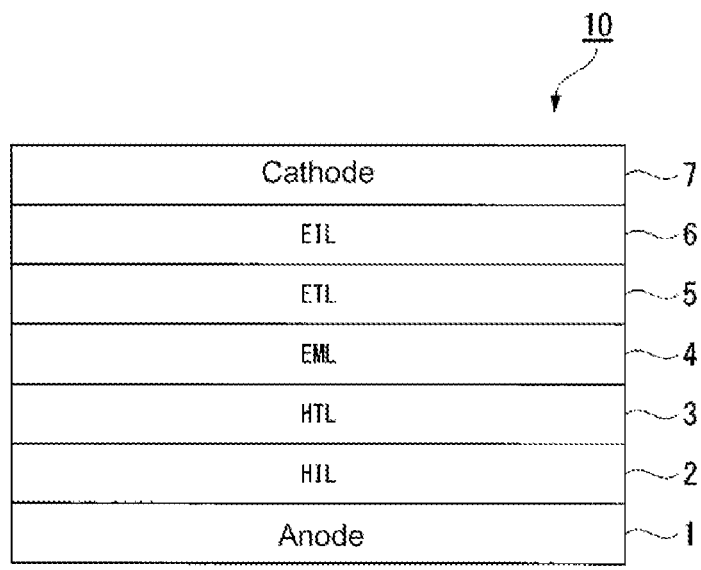
FIG. 1 is a schematic diagram showing an example of the layer structure of an organic photoelectronic element of the present invention.

The charge injection layer of the present invention contains a fluorinated polymer and a semiconductor material and has a refractive index in the wavelength range of from 450 nm to 800 nm, of at most 1.60.

The "refractive index in the wavelength range of from 450 nm to 800 nm" in the present invention means that the refractive index is at most 1.60 over all wavelengths in the wavelength range of from 450 nm to 800 nm.

Of the charge injection layer of the present invention, the refractive index in the wavelength range of from 450 nm to 800 nm is at most 1.60, preferably at most 1.55, more preferably at most 1.50, further preferably at most 1.45. When the refractive index is at most 1.60, the evanescent wave to excite surface plasmons in proportion to the refractive index becomes small, whereby loss of light by plasmon absorption will be reduced to improve the light extraction efficiency of the organic photoelectronic element. On the other hand, the refractive index of the charge injection layer of the present invention, is preferably at least 1.30, more preferably at least 1.35, further preferably at least 1.40, with a view to reducing the refractive index difference between the adjacent charge transport layer and charge injection layer in order to reduce film guided light.

In the charge injection layer of the present invention, the volume ratio represented by (the content of the fluorinated polymer):(the content of the semiconductor material) is preferably from 70:30 to 5:95, more preferably from 60:40 to 20:80. When the volume ratio of the fluorinated polymer to the semiconductor material is within the above range, the refractive index of the charge injection layer will be lowered to a level equal to the refractive index of an electrode or a glass substrate thereby to improve the light extraction efficiency in the organic photoelectronic element, such being preferred.

The charge injection layer of the present invention is useful as a charge injection layer for injecting charges from an electrode into the light emitting layer in an organic photoelectronic element. The charge injection layer of the present invention may be a hole injection layer in contact with the anode, or it may be an electron injection layer in contact with the cathode.

Hereinafter, the material for the charge injection layer of the present invention will be described.

Fluorinated Polymer

The fluorinated polymer contained in the charge injection layer of the present invention is a polymer containing fluorine atoms. In the present invention, an oligomer is also included in the polymer. That is, the fluorinated polymer may be an oligomer.

The fluorinated polymer preferably has an evaporation rate or saturated vapor pressure sufficient for practical use below a temperature where thermal decomposition of the fluorinated polymer takes place, from the viewpoint of the formation rate of a layer such as a charge injection layer or a charge transport layer, and the strength and surface roughness of the layer. The thermal decomposition initiation temperature of PTFE being a common fluorinated polymer is about 400° C., and the thermal decomposition initiation temperature of Teflon (registered trademark) AF is 350° C. The evaporation rate at 300° C. of the fluorinated polymer according to this embodiment is preferably at least 0.01 g/m$^2$sec, more preferably at least 0.02 g/m$^2$sec. Further, the saturated vapor pressure is preferably at least 0.001 Pa, more preferably at least 0.002 Pa. From this viewpoint, the fluorinated polymer is preferably a perfluoropolymer, of which the intermolecular interaction is considered to be small. Further, a polymer having an aliphatic ring structure in its main chain, of which crystallinity is said to be low, is more preferred. Here, having an aliphatic ring structure in its main chain means that the fluorinated polymer has an aliphatic ring structure (ring structure which does not exhibit aromaticity) in repeating units, and at least one of carbon atoms constituting the aliphatic ring constitutes the main chain.

In this specification, the saturated vapor pressure (unit: Pa) is a value measured by a vacuum differential thermal balance (manufactured by ADVANCE RIKO, Inc.: VPE-9000).

The weight average molecular weight (hereinafter represented by "Mw") of the fluorinated polymer is preferably from 1,500 to 50,000, more preferably from 3,000 to 40,000, further preferably from 5,000 to 30,000. When the weight average molecular weight is at least 1,500, sufficient strength will be easily obtainable in the case of forming a layer by the fluorinated polymer formed. On the other hand, when the weight average molecular weight is at most 50,000, the polymer will have a saturated vapor pressure which gives a practical layer forming rate (film-deposition rate), whereby it will be unnecessary to heat the deposition source to a high temperature, specifically to a temperature exceeding 400° C. If the temperature of the deposition source is too high, the main chain of the fluorinated polymer will be cleaved in the vapor deposition process, whereby the fluorinated polymer ends up to have a low molecular weight, and the strength of the layer formed becomes insufficient, and further defects attributable to decomposed products will be formed, and it will be difficult to obtain a smooth surface. Moreover, such a possibility is assumed that molecules or ions unintentionally included by cleavage of the main chain will affect the electrical conductivity of the film or the emission lifetime of the organic EL element.

Therefore, when Mw is in the range of from 1,500 to 50,000, the main chain of the fluorinated polymer will not undergo cleavage, and it is possible to form a layer having a sufficient strength and smooth surface.

The "polydispersity" is meant for the ratio of Mw to the number average molecular weight (hereinafter represented by "Mn"), i.e. Mw/Mn. From the viewpoint of stability of the quality in the layer to be formed, the polydispersity (molecular weight distribution) (Mw/Mn) of the fluorinated polymer should better be smaller, and is preferably at most 2. Here, the theoretical lower limit value of the polydispersity is 1. As a method of obtaining a fluorinated polymer having a small polydispersity, a method of carrying out controlled polymerization such as living radical polymerization, a molecular weight fractionation purification method using size exclusion chromatography, or a molecular weight fractionation purification method by sublimation purification, may be mentioned. Among these methods, in consideration of stability of the vapor deposition rate when a vapor deposition method is applied for the formation of the layer, it is preferred to carry out sublimation purification.

In this specification, Mw and Mn are values measured by gel permeation chromatography (GPC).

The glass transition temperature (Tg) of the fluorinated polymer should better be high, because the reliability of the obtainable element will be high. Specifically, the glass transition temperature is preferably at least 60° C., more preferably at least 80° C., particularly preferably at least 100° C. The upper limit is not particularly limited, but is preferably 350° C., more preferably 300° C.

In a case where the perfluoropolymer having a fluorinated aliphatic ring structure in its main chain is a perfluoropolymer consisting solely of repeating units formed by cyclopolymerization of perfluoro(3-butenyl vinyl ether), the intrinsic viscosity [η] is preferably from 0.01 to 0.14 dl/g, more preferably from 0.02 to 0.1 dl/g, particularly preferably from 0.02 to 0.08 dl/g. When [η] is at least 0.01 dl/g, the molecular weight of the fluorinated polymer becomes relatively large, and sufficient strength tends to be easily obtainable in the layer after formation. On the other hand, when [η] is at most 0.14 dl/g, the molecular weight of the fluorinated polymer becomes relatively small, and the polymer will have a saturated vapor pressure which gives a practical deposition rate.

In this specification, the intrinsic viscosity [η] (unit: dl/g) is a value measured by Ubbelohde viscometer (manufactured by Shibata Scientific Technology Ltd.: viscometer Ubbelohde) at a measurement temperature of 30° C. by using ASAHIKLIN (registered trademark) AC2000 (manufactured by Asahi Glass Company, Limited) as the solvent.

The upper limit value for the refractive index at a wavelength of from 450 nm to 800 nm of the fluorinated polymer is preferably 1.5, more preferably 1.4. When the refractive index is at most 1.5, it is possible to lower the refractive index of a layer such as a charge injection layer or charge transport layer obtainable by mixing with an organic semiconductor material, to about 1.55 which is approximately the same level as the refractive index of e.g. a glass substrate, whereby the light extraction efficiency will be improved, such being preferred. On the other hand, the theoretical lower limit value for the refractive index is 1.0.

The refractive index of the organic semiconductor material is generally from about 1.7 to 1.8. To such a common organic semiconductor material, by mixing the fluorinated polymer having a refractive index of at most 1.5, it is possible to lower the refractive index of the obtainable charge injection layer, charge transport layer, etc. When the refractive index of the charge injection layer or charge transport layer is lowered and becomes to be close to the refractive index of an electrode or glass substrate (the refractive indexes of soda glass and quartz glass are, respectively, from about 1.51 to 1.53 and from about 1.46 to 1.47) adjacent to the charge injection layer or charge transport layer, it is possible to avoid the total reflection occurring at the interface between the charge injection layer or charge transport layer, and the electrode or glass substrate, whereby light extraction efficiency will be improved.

As the fluorinated polymer, the following polymer (1) or (2) may be mentioned.

Polymer (1): a fluorinated polymer having no aliphatic ring and having units (hereinafter referred to also as "fluoroolefin units") derived from a fluoroolefin in the main chain.

Polymer (2): a fluorinated polymer having an aliphatic ring in the main chain.

Polymer (1)

The polymer (1) may be a homopolymer of a fluoroolefin, or may be a copolymer of a fluoroolefin and another monomer copolymerizable with the fluoroolefin.

The fluoroolefin may be tetrafluoroethylene, hexafluoropropylene, chlorotrifluoroethylene, vinylidene fluoride, vinyl fluoride, a perfluoroalkyl ethylene (such as one having a $C_{1-10}$ perfluoroalkyl group), trifluoroethylene, a perfluoro (alkyl vinyl ether), etc.

Among the exemplified ones, tetrafluoroethylene, hexafluoropropylene, or a perfluoro(alkyl vinyl ether), where all of the hydrogen atoms bonded to carbon atoms are substituted by fluorine, is preferred, since it is thereby easy to lower the refractive indexes of the charge injection layer and the charge transport layer.

As another monomer copolymerizable with the fluoroolefin, a vinyl ether, a vinyl ester, an aromatic vinyl compound, an allyl compound, an acryloyl compound, a methacryloyl compound, etc. may be mentioned.

In a case where the polymer (1) is a copolymer, the proportion of units derived from a fluoroolefin is preferably at least 20 mol %, more preferably at least 40 mol %, further preferably at least 80 mol %.

A functional group at a terminal of the main chain of the polymer (1) is preferably a less reactive functional group. The less reactive functional group may, for example, be an alkoxycarbonyl group, a trifluoromethyl group or the like.

As the polymer (1), a synthesized one may be used, or a commercially available product may be used.

As the polymer (1), the following fluorinated polymers may be mentioned.

Polytetrafluoroethylene (PTFE), a tetrafluoroethylene-perfluoro(alkyl vinyl ether) copolymer (manufactured by Asahi Glass Company, Limited: Fluon (registered trademark) PFA), a tetrafluoroethylene/hexafluoropropylene copolymer (FEP), a tetrafluoroethylene/perfluoro(alkyl vinyl ether)/hexafluoropropylene copolymer (EPA), an ethylene-tetrafluoroethylene copolymer (manufactured by Asahi Glass Company, Limited: Fluon (registered trademark) ETFE), polyvinylidene fluoride (PVdF), polyvinyl fluoride (PVF), polychlorotrifluoroethylene (PCTFE), an ethylene/chlorotrifluoroethylene copolymer (ECTFE), etc.

Among the exemplified ones, polytetrafluoroethylene (PTFE), a tetrafluoroethylene/perfluoro(alkyl vinyl ether) copolymer (PFA), a tetrafluoroethylene/hexafluoropropylene copolymer (FEP), or a tetrafluoroethylene/perfluoro(alkyl vinyl ether)-hexafluoropropylene copolymer (EPA), in which all hydrogen atoms or chlorine atoms bonded to carbon atoms are substituted by fluorine, is preferred, since it is thereby easy to lower the refractive indexes of the charge injection layer and the charge transport layer.

The polymer (1) can be produced by using a known method.

As the polymer (1), a synthesized one may be used, or a commercially available product may be used.

Polymer (2)

The polymer (2) is a fluorinated polymer having an aliphatic ring in the main chain.

The "fluorinated polymer having an aliphatic ring structure in the main chain" means that the fluorinated polymer has units having an aliphatic ring structure, and at least one of carbon atoms constituting the aliphatic ring is a carbon atom constituting the main chain. The aliphatic ring may be a ring having a hetero atom such as an oxygen atom.

The "main chain" of a polymer is, in a polymer of a monoene having a polymerizable double bond, meant for a chain of carbon atoms derived from two carbon atoms constituting the polymerizable double bond, or is, in a cyclized polymer of a cyclopolymerizable diene, meant for a chain of carbon atoms derived from four carbon atoms constituting the two polymerizable double bonds. In a copolymer of a monoene and cyclopolymerizable diene, the main chain is constituted by the above two carbon atoms of the monoene and the above four carbon atoms of the diene.

Therefore, a polymer of a monoene having an aliphatic ring is a polymer of a monoene of a structure in which one carbon atom constituting the ring skeleton of the aliphatic ring, or adjacent two carbon atoms constituting the ring skeleton, are carbon atoms constituting the polymerizable double bond. In the case of a cyclized polymer of a cyclopolymerizable diene, as will be described later, from 2 to 4 among 4 carbon atoms constituting the two double bonds become carbon atoms constituting the aliphatic ring.

The number of atoms constituting the ring skeleton of the aliphatic ring in the polymer (2) is preferably from 4 to 7, particularly preferably from 5 to 6. That is, the aliphatic ring is preferably a 4 to 7-membered ring, particularly preferably a 5 to 6-membered ring. When the polymer has a hetero atom as an atom constituting the ring of the aliphatic ring, the hetero atom may be an oxygen atom, a nitrogen atom or the like, preferably an oxygen atom. Further, the number of hetero atoms constituting the ring is preferably from 1 to 3, more preferably 1 or 2.

The aliphatic ring may have a substituent, or may not have a substituent. "May have a substituent" means that a substituent may be attached to an atom constituting the ring skeleton of the aliphatic ring.

Hydrogen atoms bonded to carbon atoms constituting the aliphatic ring in the polymer (2) are preferably substituted by fluorine atoms. Further, in a case where the aliphatic ring has a substituent and has hydrogen atoms bonded to carbon atoms in the substituent, the hydrogen atoms are preferably substituted by fluorine atoms. The substituent having fluorine atoms may be a perfluoroalkyl group, a perfluoroalkoxy group, $=CF_2$, etc.

As the aliphatic ring in the polymer (2), a perfluoro aliphatic ring (an aliphatic ring in which all of hydrogen atoms bonded to carbon atoms including a substituent, are substituted by fluorine atoms) is preferred, since it is thereby easy to lower the refractive indexes of the charge injection layer and the charge transport layer.

As the polymer (2), the following polymers (21) and (22) may be mentioned.

Polymer (21): a fluorinated polymer having units derived from a fluorinated cyclic monoene.

Polymer (22): a fluorinated polymer having units formed by cyclopolymerization of a cyclopolymerizable fluorinated diene (hereinafter simply referred to also as a "fluorinated diene").

Fluoropolymer (21):

The "fluorinated cyclic monoene" is a fluorinated monomer having one polymerizable double bond between carbon atoms constituting an aliphatic ring or a fluorinated monomer having one polymerizable double bond between a carbon atom constituting an aliphatic ring and a carbon atom outside of the aliphatic ring.

As the fluorinated cyclic monoene, the following compound (1) or compound (2) is preferred.

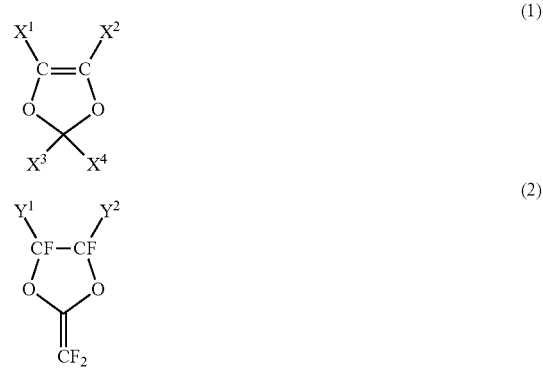

[wherein $X^1$, $X^2$, $X^3$, $X^4$, $Y^1$ and $Y^2$ are each independently a fluorine atom, a perfluoroalkyl group which may contain an etheric oxygen atom (—O—) or a perfluoroalkoxy group which may contain an etheric oxygen atom, and $X^3$ and $X^4$ may be bonded to each other to form a ring.]

Of the perfluoroalkyl group in $X^1$, $X^2$, $X^3$, $X^4$, $Y^1$ and $Y^2$, the number of carbon atoms is preferably from 1 to 7, particularly preferably from 1 to 4. The perfluoroalkyl group is preferably a linear or branched chain, particularly preferably a linear chain. Specifically, a trifluoromethyl group, a pentafluoroethyl group, a heptafluoropropyl group, etc. may be mentioned, and a trifluoromethyl group is particularly preferred.

As the perfluoroalkoxy group in $X^1$, $X^2$, $X^3$, $X^4$, $Y^1$ and $Y^2$, one having an oxygen atom (—O—) bonded to the above perfluoroalkyl group may be mentioned, and a trifluoromethoxy group is particularly preferred.

In the formula (1), $X^1$ is preferably a fluorine atom.

$X^2$ is preferably a fluorine atom, a trifluoromethyl group or a $C_{1-4}$ perfluoroalkoxy group, particularly preferably a fluorine atom or a trifluoromethoxy group.

$X^3$ and $X^4$ are each independently preferably a fluorine atom or a $C_{1-4}$ perfluoroalkyl group, particularly preferably a fluorine atom or a trifluoromethyl group.

$X^3$ and $X^4$ may be bonded to each other to form a ring. The number of atoms constituting the ring skeleton of the ring is preferably from 4 to 7, particularly preferably from 5 to 6.

As preferred specific examples of the compound (1), compounds (1-1) to (1-5) may be mentioned.

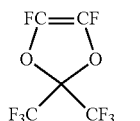

(1-1)

(1-2)

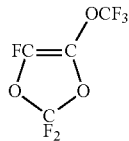

(1-3)

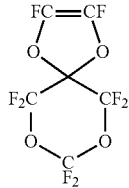

(1-4)

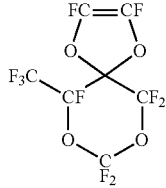

(1-5)

In the formula (2), $Y^1$ and $Y^2$ are each independently preferably a fluorine atom, a $C_{1-4}$ perfluoroalkyl group, or a $C_{1-4}$ perfluoroalkoxy group, particularly preferably a fluorine atom or a trifluoromethyl group.

As preferred examples of the compound (2), compounds (2-1) and (2-2) may be mentioned.

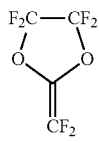

(2-1)

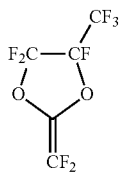

(2-2)

The polymer (21) may be a homopolymer of the above-mentioned fluorinated cyclic monoene, or a copolymer of the fluorinated cyclic monoene and another copolymerizable monomer.

Here, the proportion of units derived from the fluorinated cyclic monoene to all units in the polymer (21) is preferably at least 20 mol %, more preferably at least 40 mol %, further preferably 100 mol %.

Another monomer copolymerizable with the fluorinated cyclic monoene may, for example, be a fluorinated diene, a monomer having a reactive functional group in the side chain, tetrafluoroethylene, chlorotrifluoroethylene, a perfluoro(methyl vinyl ether), etc.

The fluorinated diene may be the same one as mentioned in the following description of the polymer (22). The monomer having a reactive functional group in the side chain may be a monomer having a polymerizable double bond and a reactive functional group. The polymerizable double bond may be $CF_2$=CF—, $CF_2$=CH—, $CH_2$=CF—, $CFH$=CF—, $CFH$=CH—, $CF_2$=C—, CF=CF—, etc. The reactive functional group may be the same one as mentioned in the following description of the polymer (22).

A polymer obtainable by copolymerization of a fluorinated cyclic monoene and a fluorinated diene shall be deemed to be a polymer (21).

Polymer (22):

The "fluorinated diene" is a cyclopolymerizable fluorinated monomer having two polymerizable double bonds and fluorine atoms. As the polymerizable double bond, a vinyl group, an allyl group, an acryloyl group, or a methacryloyl group is preferred. As the fluorinated diene, the following compound (3) is preferred.

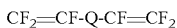

$CF_2$=CF-Q-CF=$CF_2$ (3).

In the formula (3), Q is a $C_{1-5}$, preferably $C_{1-3}$, perfluoroalkylene group which may have a branch and which may contain an etheric oxygen atom, wherein some of fluorine atoms may be substituted by a halogen atom other than a fluorine atom. The halogen atom other than a fluorine atom may be a chlorine atom, a bromine atom, etc.

Q is preferably a perfluoroalkylene group containing an etheric oxygen atom. In that case, an etheric oxygen atom in the perfluoroalkylene group may be present at one terminal of the perfluoroalkylene group, may be present at both terminals of the perfluoroalkylene group, or may be present between carbon atoms of the perfluoroalkylene group. From the viewpoint of cyclopolymerizability, it is preferred that an etheric oxygen atom is present at one terminal of the perfluoroalkylene group.

As specific examples of the compound (3), the following compounds may be mentioned.

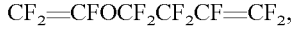
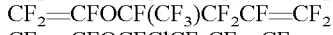
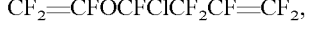

$CF_2$=CFOCF$_2$CF=CF$_2$,
$CF_2$=CFOCF(CF$_3$)CF=CF$_2$,
$CF_2$=CFOCF$_2$CF$_2$CF=CF$_2$,
$CF_2$=CFOCF$_2$CF(CF$_3$)CF=CF$_2$,
$CF_2$=CFOCF(CF$_3$)CF$_2$CF=CF$_2$,
$CF_2$=CFOCFClCF$_2$CF=CF$_2$, $CF_2=CFOCCl_2CF_2CF=CF_2$,
$CF_2=CFOCF_2OCF=CF_2$,
$CF_2=CFOC(CF_3)_2OCF=CF_2$,
$CF_2=CFOCF_2CF(OCF_3)=CF_2$,
$CF_2=CFCF_2CF=CF_2$,
$CF_2=CFCF_2CF_2CF=CF_2$,
$CF_2=CFCF_2OCF_2CF=CF_2$.

As units to be formed by cyclopolymerization of the compound (3), the following units (3-1) to (3-4), etc. may be mentioned.

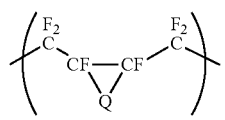
(3-1)

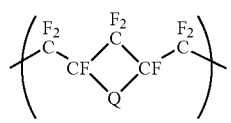
(3-2)

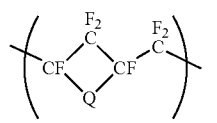
(3-3)

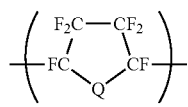
(3-4)

The polymer (22) may be a homopolymer of a fluorinated diene, or may be a copolymer of a fluorinated diene and another copolymerizable monomer.

Another monomer copolymerizable with the fluorinated diene may, for example, be a monomer having a reactive functional group in the side chain, tetrafluoroethylene, chlorotrifluoroethylene, perfluoro(methyl vinyl ether), etc.

A specific example of the polymer (22) may, for example, be a polymer represented by the following formula (3-1-1) obtainable by cyclopolymerization of $CF_2=CFOCF_2CF_2CF=CF_2$ (perfluoro(3-butenyl vinyl ether)).

In the following, perfluoro(3-butenyl vinyl ether) may be referred to as "BVE".

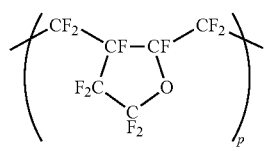
(3-1-1)

Here, in the formula (3-1-1), p is an integer of from 5 to 1,000.

p is preferably an integer of from 10 to 800, particularly preferably an integer of from 10 to 500.

A functional group at a terminal of the main chain of the polymer (2) is preferably a less reactive functional group. The less reactive functional group may, for example, be an alkoxycarbonyl group, a trifluoromethyl group or the like.

As the polymer (2), a synthesized one may be used, or a commercially available product may be used.

Specific examples of the polymer (2) are preferably a BVE cyclized polymer (manufactured by Asahi Glass Company, Limited: CYTOP (registered trademark)), a tetrafluoroethylene/perfluoro(4-methoxy-1,3-dioxole) copolymer (manufactured by Solvay: Hyflon (registered trademark) AD), a tetrafluoroethylene/perfluoro(2,2-dimethyl-1,3-dioxole) copolymer (manufactured by DuPont: Teflon (registered trademark) AF), and a perfluoro(4-methyl 2-methylene-1,3-dioxolane) polymer (MMD polymer).

In the present invention, the fluorinated polymer is preferably the polymer (2), more preferably the polymer (22), particularly preferably a fluorinated polymer represented by the formula (3-1-1) obtainable by cyclopolymerization of BVE.

Semiconductor Material

The semiconductor material which the charge injection layer of the present invention contains, may be an organic semiconductor or an inorganic semiconductor, but from such a viewpoint that it is easy to control the refractive index, and it is easy to mix with the fluorinated polymer, it is preferably an organic semiconductor.

The semiconductor material which the charge injection layer of the present invention contains, may be one type, or two or more types.

Inorganic Semiconductor

The inorganic semiconductor material may, for example, be a metal oxide such as $MoO_3$ or tungsten oxide represented by WOx (x is an optional integer). $MoO_3$ is suitable as a hole injection material to receive injection of holes from the anode side and transport them.

Organic Semiconductor

The organic semiconductor material is an organic compound material showing semiconductor-like electrical properties. The organic semiconductor material can be classified into a hole injection material to receive injection of holes from the anode and transport them, and an electron injection material to receive injection of electrons from the cathode and transport them. In the present invention, both may suitably be used, but the hole injection material is particularly preferably used.

As the hole injection material, an aromatic amine derivative can be preferably exemplified. Specific examples may be the following α-NPD, TAPC, PDA, TPD, m-MTDATA, etc., but are not limited thereto.

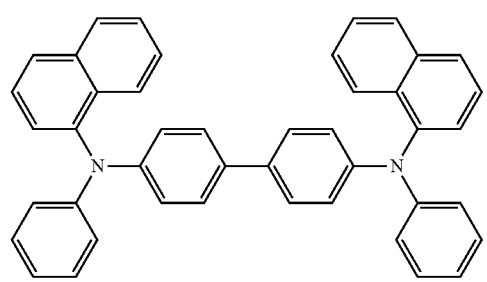

α-NPD

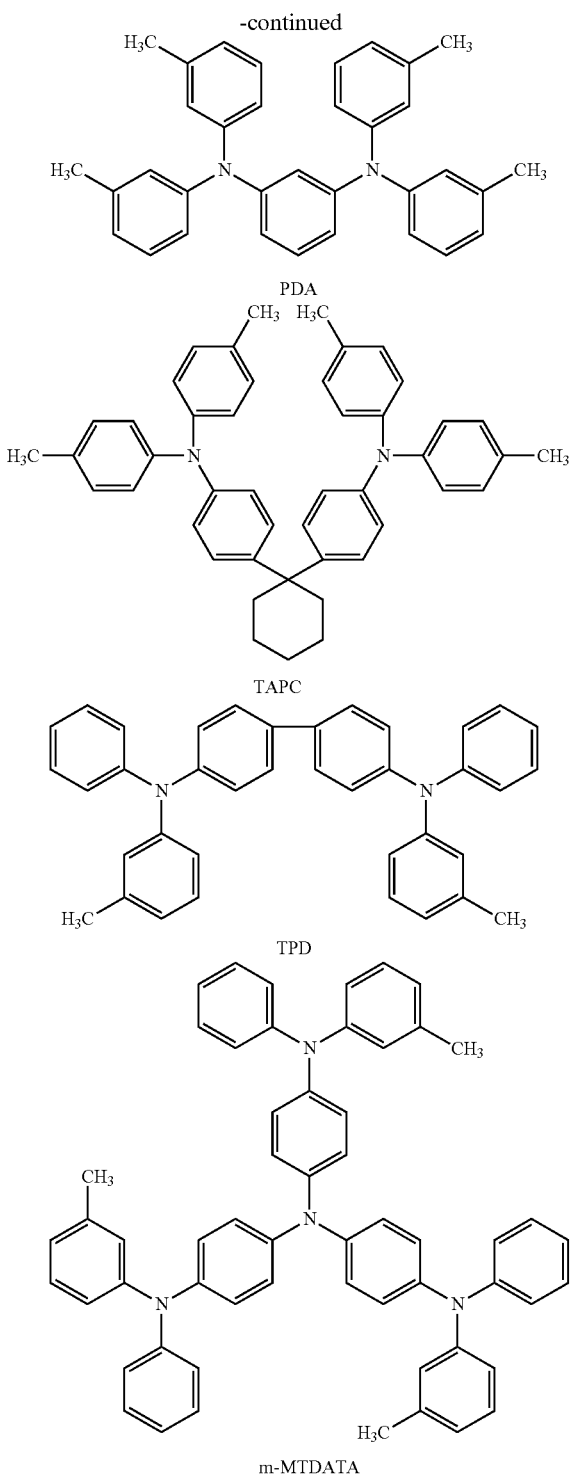

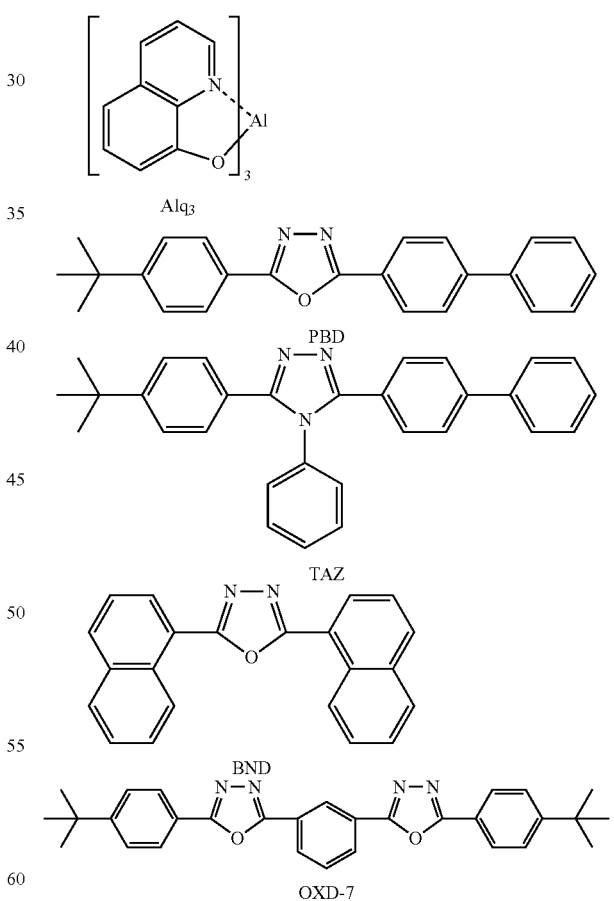

9H,9'H,9"H-3,3':6',3"-tercarbazole (Tris-PCz), or 4,4',4"-tris(N,N-2-naphthylphenylamino)triphenylamine (2-TNATA), a polymer semiconductor material such as polyaniline/dodecylbenzenesulfonic acid (PANI/DBSA), poly(3,4-ethylenedioxythiophene)/poly(4-styrenesulfonate) (PEDOT/PSS), polyaniline camphorsulfonic acid (PANI/CSA), or polyaniline/poly(4-styrenesulfonate) (PANI/PSS), N-(diphenyl-4-yl)-9,9-dimethyl-N-(4-(9-phenyl-9H-carbazoyl-3-yl)phenyl)-9H-fluorene-2-amine (hereinafter referred to as "HT211"), HTM081 (manufactured by Merck), HTM163 (manufactured by Merck), HTM222 (manufactured by Merck), NHT-5 (manufactured by Novaled), NHT-18 (manufactured by Novaled), NHT-49 (manufactured by Novaled), NHT-51 (manufactured by Novaled), NDP-2 (manufactured by Novaled), NDP-9 (manufactured by Novaled), etc. Of the illustrated hole injection layer forming materials, commercial products may be purchased. As such a hole injection material, a commercially available product may be used, or a synthesized product may be used. Further, as the hole injection material, one type may be used alone, or two or more types may be used in combination.

As the electron injection material, a known one may be used. Specific examples may be inorganic compounds such as LiF, $Cs_2CO_3$, CsF, etc., and the following $Alq_3$, PBD, TAZ, BND, OXD-7, etc., but are not limited thereto.

The hole injection material other than one mentioned above may, for example, be a semiconductor material of a metal oxide such as molybdenum oxide or tungsten oxide, an organic metal complex material such as copper phthalocyanine, an arylamine material such as N,N'-diphenyl-N,N'-bis-[4-(phenyl-m-tolyl-amino)-phenyl]-biphenyl-4,4'-diamine (DNTPD), N,N'-di(1-naphthyl)-N,N'-diphenyl benzidine (NPB), 4,4',4"-tris(N,N-diphenylamino)triphenylamine (TDATA), dipyrazino[2,3-f:2',3'-h]quinoxaline-2,3,6,7,10,11-hexacarbonitrile (HAT-CN), 9,9',9"-triphenyl- The charge injection layer of the present invention may contain other materials in addition to the fluorinated polymer and the semiconductor material, but is preferably made of the fluorinated polymer and the semiconductor material. Here, as the semiconductor material, one type may be used alone, or two or more types may be used in combination. Also as the fluorinated polymer, one type may be used alone, or two or more types may be used in combination.

The thickness of the charge injection layer of the present invention is not particularly limited, but is preferably from 1 nm to 350 nm, more preferably from 5 nm to 300 nm.

The charge injection layer of the present invention has an absorption coefficient in the wavelength range of from 450 nm to 800 nm, of preferably at most 5,000 cm$^{-1}$, more preferably at most 1,000 cm$^{-1}$, and particularly preferably, it has no absorption band in said wavelength range. If the absorption coefficient exceeds 5,000 cm$^{-1}$, when light passes once through the charge injection layer having a thickness of 100 nm, 5% of the light will be absorbed, out of the total amount of the light before passing being 100%. Inside of an organic photoelectronic element, due to multiple interference of light, losses by absorption of light at the time of passing through the charge injection layer, will accumulate, and therefore, the absorption of light at the time of passing through the charge injection layer will be a factor to significantly lower the light extraction efficiency. It is extremely important to use a charge injection layer having a sufficiently small light absorption, in order not to impair the light emitting efficiency of the organic photoelectronic element. When the light emitting efficiency of the organic photoelectronic element is not impaired, energy utilization efficiency will be high, and as a result that heat generation due to light absorption is suppressed, the lifetime of the element will be prolonged. In the present invention, the "absorption coefficient (unit: cm$^{-1}$)" is a value measured in accordance with JIS K 0115.

Method for Producing Charge Injection Layer

The charge injection layer of the present invention may be produced, for example, by applying a known dry coating method and a wet coating method to a mixture of the fluorinated polymer and the semiconductor material.

As the dry coating method, for example, a physical vapor deposition method such as a resistance heating vapor deposition method, an electron beam vapor deposition method, or a sputtering method may be mentioned. A co-vapor deposition method to vapor-deposit the respective components simultaneously, is preferred in order to conduct the film deposition by uniformly mixing the fluorinated polymer and the semiconductor material and the dopant as an optional component in an optional ratio to form a charge injection layer.

One preferred embodiment of the method for producing a charge injection layer of the present invention, is a production method containing a step of co-vapor depositing the fluorinated polymer and the semiconductor material and the dopant as an optional component, on an electrode optionally selected from the anode and the cathode.

In the above co-vapor deposition, the total vapor deposition rate of the fluorinated polymer and the semiconductor material and the dopant as an optional component, is not particularly limited, but is, for example, from 0.001 to 10 nm/s, from such a viewpoint that it is thereby easy to obtain a uniform film composition in an optional mixing ratio.

By suitably adjusting the vapor deposition rates of the respective components, the content ratio of the respective components contained in the charge injection layer to be formed can be adjusted.

According to this embodiment, the respective material components tend to be uniformly mixed, whereby it is possible to produce the charge injection layer of the present invention having a sufficiently low refractive index and having a uniform material composition in good yield.

The charge injection layer of the present invention is prepared, for example, by a preparation method according to the following dry coating method.

As the substrate, a glass substrate having indium tin oxide (ITO) film-deposited is used. This substrate is sequentially subjected to ultrasonic cleaning by using neutral detergent, acetone and isopropanol. Then, it is boil-washed in isopropanol and introduced into an ozone treatment apparatus, wherein unwanted impurities on the ITO film surface are removed.

This substrate is placed in a vacuum vapor deposition machine, and after being evacuated to a pressure of at most 10$^{-4}$ Pa, a fluorinated polymer such as an ethylene-tetrafluoroethylene copolymer (ETFE) and an organic semiconductor material such as HAT-CN or an inorganic semiconductor material such as MoO$_3$ are subjected to resistance heating and co-vapor deposition in the vacuum vapor deposition machine to prepare a charge injection layer on the substrate. The total vapor deposition rate of all materials is preferably 2.0 Å/s.

As the wet coating method, for example, an inkjet method, a cast coating method, a dip coating method, a bar coating method, a blade coating method, a roll coating method, a gravure coating method, a flexo coating method, and a spray coating method may be mentioned.

By using one of these wet coating methods, a liquid composition for forming a charge injection layer is applied onto a desired substrate, followed by drying and curing, whereby it is possible to form a charge injection layer.

The above liquid composition preferably contains the fluorinated polymer and the semiconductor material, and the dopant as an optional component, in an optional ratio in a uniformly mixed state. In the liquid composition, a diluent solvent removable by drying may be contained.

One preferred embodiment of the method for producing a charge injection layer of the present invention is a production method having a step of applying a liquid composition comprising the fluorinated polymer and the semiconductor material and the dopant as an optional component, on an electrode selected from an anode and a cathode.

In a case where a volatile component such as a diluent solvent is contained in the liquid composition, it is preferred to have also a step of evaporating the volatile component.

By suitably adjusting the content proportions of the respective components contained in the liquid composition, it is possible to adjust the content ratio of the respective components contained in the charge injection layer to be formed.

According to this embodiment, the respective material components tend to be uniformly mixed, whereby it is possible to produce the charge injection layer of the present invention having a sufficiently low refractive index and having a uniform material composition, in good yield.

The charge injection layer of the present invention is prepared, for example, by a preparation method according to the following a wet coating method.

As the substrate, a glass substrate having indium tin oxide (ITO) film-deposited, is used. This substrate is sequentially subjected to ultrasonic cleaning by using a neutral detergent, acetone and isopropanol. Then, it is boil-washed in isopropanol and introduced into an ozone treatment apparatus, wherein unwanted impurities on the ITO film surface are removed.

A styrene acrylic resin is added to a mixed liquid of water and methanol (1:1, v/v) at a concentration of 10 wt %. A semiconductor material such as copper phthalocyanine (CuPc) and a fluorinated polymer such as polyvinylidene fluoride (PVDF) are, respectively, added at a concentration of 10 wt % to the styrene acrylic resin and dispersed for 4 hours by a sonicator. The above-mentioned substrate is introduced into a spin coater, and the sonication dispersion is dropped onto the substrate and spin coated. The obtained coated substrate is baked at 200° C. for 10 minutes on a hot plate to obtain the substrate having a coating film formed.

The production method for the charge injection layer of the present invention may be a dry coating method or a wet coating method, but from such a viewpoint that the fluorinated polymer and the semiconductor material and the dopant as an optional component can easily be formed into a film in a uniform mixing ratio, a dry coating method is preferred.

Accordingly, the charge injection layer of the present invention is preferably a physical vapor deposition layer film-deposited by a physical vapor deposition method.

The charge injection layer of the present invention can be utilized for an organic photoelectronic device such as an organic electroluminescent element, an organic transistor, a solar cell, an organic photo diode or an organic laser.

The charge injection layer of the present invention is particularly suitable for an organic electroluminescent element (organic EL element). The organic electroluminescent element may be a top emission type, or may be a bottom emission type. Such an organic electroluminescent element may be mounted, for example, on an organic EL device such as an organic EL display, or an organic EL illumination.

Dopant

The charge injection layer of the present invention may contain an inorganic compound as a dopant, in addition to an organic semiconductor as the main material, may contain another organic compound (but excluding a fluorinated polymer) as a dopant, in addition to an organic semiconductor as the main material, or may contain an organic compound (but excluding a fluorinated polymer) as a dopant in addition to an inorganic semiconductor as the main material.

A specific example of the dopant for forming a hole injection material may be an organic dopant such as TCNQ, $F_4$-TCNQ, PPDN, TCNNQ, $F_6$-TCNNQ, HAT-CN, HATNA, HATNA-Cl6, HATNA-F6, $C_{60}F_{36}$, $F_{16}$-CuPc, NDP-2 (manufactured by Novaled) or NDP-9 (manufactured by Novaled), or an inorganic dopant such $MoO_3$, $V_2O_5$, $WO_3$, $ReO_3$ or CuI.

The content proportion of the dopant is preferably from 10 to 200 parts by mol, more preferably from 15 to 150 parts by mol, to 100 parts by mol of the total mass of the semiconductor material. When the content proportion of the dopant is at least 10 parts by mol, the electrical conductivity of the charge injection layer will be improved. When the content proportion of the dopant is at most 200 parts by mol, the refractive index of the charge injection layer tends to be easily lowered.

Content Proportion of Fluorinated Polymer

The content proportion of the fluorinated polymer is preferably from 30 to 70 vol %, more preferably from 35 to 65 vol %, to the total of the fluorinated polymer, the semiconductor material and the dopant. When the content proportion of the fluorinated polymer is at least 30 vol %, the refractive index of the charge injection layer tends to be easily lowered. When the content proportion of the fluorinated polymer is at most 70 vol %, the electrical conductivity as a basic characteristic of the charge injection layer tends to be easily maintained.

Method for Preparing Organic EL Device

An electroluminescent element of the present invention is prepared, for example, by the following method.

On the anode 1, a hole injection layer 2 is prepared by the above-mentioned preparation method, and a hole transport layer 3, a light emitting layer 4, an electron transport layer 5, an electron injection layer 6 and a cathode 7 are sequentially laminated to prepare a laminated structure 10 as shown in FIG. 1. When a voltage is applied to the cathode and anode of the prepared organic EL device, the element is driven to emit light. When a hole injection layer having a low refractive index is used, it is possible to suppress the plasm on absorption of the anode, whereby the light extraction efficiency will be high, and high light emitting characteristics will be obtainable.

Organic Photoelectronic Element

The organic photoelectronic element of the present invention comprises an anode, a light emitting layer and a cathode, and is provided with at least one of a hole injection layer in contact with the anode, and an electron injection layer in contact with the cathode. Further, it is provided with a charge injection layer of the present invention, as at least one of the hole injection layer in contact with the anode, and the electron injection layer in contact with the cathode.

One preferred embodiment of the organic photoelectronic element of the present invention is an organic photoelectronic element which comprises an anode, a cathode provided to face the anode, a light emitting layer provided between the anode and the cathode, and a hole injection layer provided on the light emitting layer side of the anode, wherein the hole injection layer is a charge injection layer of the present invention.

One preferred embodiment of the organic photoelectronic element of the present invention is an organic photoelectronic element which comprises an anode, a cathode provided to face the anode, a light emitting layer provided between the anode and the cathode, and an electron injection layer provided on the light emitting layer side of the cathode, wherein the electron injection layer is a charge injection layer of the present invention.

A more preferred embodiment of the organic photoelectronic element of the present invention is an organic photoelectronic element which comprises an anode, a cathode provided to face the anode, a light emitting layer provided between the anode and the cathode, a hole injection layer provided on the light emitting layer side of the anode, and an electron injection layer provided on the light emitting layer side of the cathode, wherein the hole injection layer and the electron injection layer are charge injection layers of the present invention.

The layer structure of the organic photoelectronic element of the present invention is not particularly limited, and an optional functional layer may be provided between the anode and the cathode, in addition to the light emitting layer and the charge injection layer of the present invention. The material to constitute such an optional functional layer is not limited to an organic material, and may be an inorganic material.

Between the light emitting layer and the charge injection layer in contact with each electrode in the organic photoelectronic element of the present invention, a charge transport layer is preferably provided. That is, a hole transport layer is preferably provided between the light emitting layer and the hole injection layer, and an electron transport layer is preferably provided between the light emitting layer and the electron injection layer.

In a case where a charge transport layer is provided between the light emitting layer and the charge injection layer, the ratio of the thickness of the charge injection layer to the thickness of the charge transport layer is not particularly limited, but from the viewpoint of light extraction efficiency, is preferably from 1:20 to 100:1, more preferably from 1:10 to 50:1, further preferably from 1:2 to 30:1.

Also, in a case where a hole transport layer is provided between the light emitting layer and the hole injection layer, the ratio of the thickness of the hole injection layer to the thickness of the hole transport layer is not particularly limited, but from the viewpoint of light extraction efficiency, is preferably from 1:20 to 100:1, more preferably from 1:10 to 50:1, further preferably from 1:2 to 30:1.

In FIG. 1, as one preferred embodiment of the organic photoelectronic element of the present invention, a construction is shown in which an anode 1, a hole injection layer 2, a hole transport layer 3, a light emitting layer 4, an electron transport layer 5, an electron injection layer 6 and a cathode 7 are laminated in this order.

The organic photoelectronic element of the present invention may be of a bottom emission type, or a top emission type.

The hole injection layer is preferably one which has a HOMO energy level between the HOMO energy level of the hole transport layer and the work function of the anode, and which is able to reduce the hole injection barrier from the anode to the light emitting layer, or one which has a LUMO energy level at a low energy level of at most equal to the HOMO energy level of the hole transport layer, and which is able to reduce the hole injection barrier from the anode to the light emitting layer by receiving electrons from HOMO of the hole transport layer. A suitable hole injection layer can be formed by the charge injection layer of the present invention as described above. Also, a hole injection layer of a known organic photoelectronic element may be applied.

The energy level being high means being close to the vacuum level, and the energy level being low means being far from the vacuum level.

In a case where a hole transport layer is provided between a hole injection layer and a light emitting layer, the hole transport layer is preferably one which transports holes to the light emitting layer, whereby the excitation energy from the light emitting layer is less likely to move, and which has a larger energy band gap than the light emitting layer. As such a hole transport layer, a known hole transport layer may be applied.

The material for the hole transport layer may, for example, be α-NPD, PDA, TAPC, TPD or m-MTDATA, but is not limited thereto.

Other materials for the hole transport layer may, for example, be an arylamine material such as N,N'-diphenyl-N,N'-bis-[4-(phenyl-m-tolyl-amino)-phenyl]-biphenyl-4,4'-diamine (DNTPD), N,N'-di(1-naphthyl)-N,N'-diphenylbenzidine (NPB), 4,4',4"-tris(N,N-diphenylamino)triphenylamine (TDATA), dipyrazino[2,3-f:2'3'-h]quinoxaline-2,3,6,7,10,11-hexacarbonitrile (HAT-CN), 4,4',4"-tris(N,N-2-naphthylphenylamino)triphenylamine (2-TNATA), 9,9',9"-triphenyl-9H,9'H,9"H-3,3':6'3"-tercarbazole (Tris-PCz), 4,4',4"-tri(9-carbazoyl)triphenylamine (TCTA), 2,2',7,7'-tetrakis(N,N-diphenylamino)-2,7-diamino-9,9'-spirobifluorene (Spiro-TAD), or 2,2',7,7'-tetrakis(N,N-di-p-methoxyphenylamino)-9,9'-spirobifluorene (Spiro-MeOTAD); a polymer semiconductor material such as polyaniline/dodecylbenzenesulfonic acid (PANI/DBSA), poly(3,4-ethylenedioxythiophene)/poly(4-styrenesulfonate) (PEDOT/PSS), polyaniline camphorsulfonic acid (PANI/CSA), or polyaniline/poly(4-styrenesulfonate) (PANI/PSS); and commercial products such as N-(diphenyl-4-yl)-9,9-dimethyl-N-(4-(9-phenyl-9H-carbazoyl-3-yl)phenyl)-9H-fluorene-2-amine (hereinafter referred to as "HT211"), HTM081 (manufactured by Merck), HTM163 (manufactured by Merck), HTM222 (manufactured by Merck), NHT-5 (manufactured by Novaled), NHT-18 (manufactured by Novaled), NHT-49 (manufactured by Novaled), NHT-51 (manufactured by Novaled), NDP-2 (manufactured by Novaled), and NDP-9 (manufactured by Novaled).

As such a material for the hole transport layer, a commercial product may be used, or a synthetic product may be used. The hole transport layer may contain a material in common with the hole injection layer. Further, as the material for forming the hole transport layer, one type may be used alone, or two or more types may be used in combination.

The material for the hole transport layer may contain the above-mentioned dopant to facilitate the transfer of charge to and from the fluorinated polymer and the organic semiconductor material. Here, as the organic semiconductor material, one type may be used alone, or two or more types may be used in combination, and also as the fluorinated polymer, one type may be used alone, or two or more types may be used in combination.

The thickness of the hole transport layer 13 is not particularly limited, but is preferably from 10 nm to 350 nm, more preferably from 20 nm to 300 nm.

As the light emitting layer, a known light emitting layer to be used in a known organic photoelectronic element may be applied.

The light emitting layer may have the functions of an electron transport layer or an electron injection layer.

As the material for the light emitting layer, a known one such as a fluorescent material, a heat activated delayed fluorescence (TADF) material, or a phosphorescent material, may be employed. For example, the material for forming the light emitting layer 14 may be a light emitting dopant material such as (E)-2-(2-(4-(dimethylamino)styryl)-6-methyl-4H-pyran-4-ylidene)malononitrile (DCM), 4-(dicyanomethylene)-2-methyl-6-julolidyl-9-enyl-4H-pyran ($DCM_2$), Rubrene, Coumarin6, $Ir(ppy)_3$, $(ppy)_2Ir(acac)$; a phosphorescent host material such as 4,4'-bis(9H-carbazol-9-yl)biphenyl (CBP), or 3,3'-di(9H-carbazol-9-yl)-1,1'-biphenyl (mCBP); a fluorescent host material such as ADN, or $Alq_3$; or a polymer material such as polyphenylene vinylene (PPV) or MEH-PPV, but is not limited thereto. As the material for forming the light emitting layer 14, one type may be used alone, or two or more types may be used in combination, and it is suitably selected depending on the desired emission wavelength. The refractive index of the light-emitting layer 14 is from 1.65 to 1.90 in the wavelength range of from 450 nm to 800 nm, and, for example, it is from 1.70 to 1.80 at a wavelength of 600 nm.

The electron injection layer is preferably formed by a material capable of lowering the barrier of electron injection from the cathode to the light emitting layer. A suitable electron injection layer can be formed by the above-described charge injection layer of the present invention. An electron injection layer of a known organic photoelectronic element may also be applied.

The electron transport layer is preferably formed by a material which transports electrons to the light emitting layer, whereby it is easy to prevent movement of excitons generated in the light emitting layer, and which has a wide energy band gap like the hole transport layer. As the electron transport layer, a known electron transport layer may be applied.

The material for the electron transport layer may, for example, be the following Alq$_3$, PBD, TAZ, BND or OXD-7, 2,2',2"-(1,3,5-benzenetriyl)-tris(1-phenyl-1-H-benzimidazole) (TPBi), 2,9-dimethyl-4,7-diphenyl-1,10-phenanthroline (BCP), t-Bu-PBD, or a silole derivative, but is not limited thereto. The electron transport layer may contain a material in common with the electron injection layer or the light emitting layer.

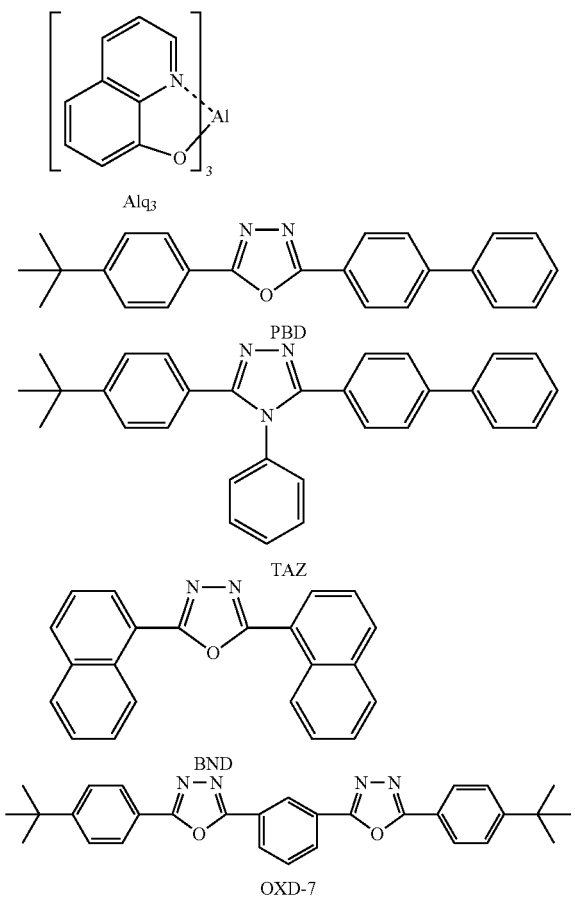

The anode is not particularly limited, and an anode for use in a known organic photoelectronic element can be applied. For example, an indium-tin oxide (ITO) electrode may be mentioned.

The cathode is not particularly limited, and a cathode for use in a known organic photoelectronic element can be applied. For example, a MgAg electrode, an Ag electrode or an Al electrode may be mentioned. On the surface of the Al electrode, a buffer layer of e.g. LiF may be formed.

The three dimensional structure of the organic photoelectronic element of the present invention is not particularly limited, and, for example, a three dimensional structure may be mentioned in which a charge injection layer, a charge transport layer and a light emitting layer are sandwiched between a pair of electrodes to let a current flow in the thickness direction. As another three dimensional structure, a three dimensional structure may be mentioned in which with respect to a charge injection layer having a charge transport layer and a light emitting layer laminated thereon, at different positions on its surface, an anode and a cathode are provided to let a current flow in the in-plane direction.

One preferred embodiment of the organic photoelectronic element of the present invention may, for example, be an organic photoelectronic element which comprises a reflective electrode, a counter electrode provided to face the reflective electrode, a light emitting layer provided between the reflective electrode and the counter electrode, a charge transport layer provided between the reflective electrode and the light emitting layer, and a charge injection layer in contact with the reflective electrode between the charge transport layer and the reflective electrode.

The charge injection layer is the above-described charge injection layer of the present invention and contains the fluorinated polymer and the semiconductor material, and the refractive index in the wavelength range of 450 nm to 800 nm of the charge injection layer is at most 1.60.

The reflective electrode is an electrode having a function to reflect the light arrived from the light emitting layer to the counter electrode side.

The reflective electrode may be an anode, or may be a cathode.

The material for the reflective electrode may, for example, be Ag, Al, or an Al alloy such as AlNd.

The reflective electrode may have a laminated structure of a layer formed of an electrically conductive metal oxide material such as ITO (Indium Tin Oxide: indium-doped tin oxide) or IZO (Indium Zinc Oxide: indium-doped zinc oxide) and a reflective layer formed of a metal material such as Ag or Al.

A top emission type organic photoelectronic element provided with the above reflective electrode may, for example, have a layer structure comprising sequentially from the bottom, Ag as a reflective layer/an anode made of ITO-coated glass substrate/a hole injection layer of the present invention/a hole transport layer/a light emitting layer/an electron transport layer/an electron injection layer/a MgAg cathode as a counter electrode.

One preferred embodiment of the organic photoelectronic element of the present invention may, for example, be an organic photoelectronic element which comprises a transparent electrode, a counter electrode provided to face the transparent electrode, a light emitting layer provided between the transparent electrode and the counter electrode, a charge transport layer provided between the transparent electrode and the light emitting layer, and a charge injection layer in contact with the transparent electrode between the charge transport layer and the transparent electrode.

The charge injection layer is the above-described charge injection layer of the present invention, and contains the fluorinated polymer and the semiconductor material, and the refractive index in the wavelength range of from 450 nm to 800 nm of the charge injection layer is at most 1.60.

The above transparent electrode is a transparent electrode that transmits the light arrived from the light emitting layer to the outside of the element.

The transparent electrode may be an anode, or may be a cathode, but from the viewpoint of enhancing the light extraction efficiency, it is preferably an anode.

The transparent electrode may, for example, be an ITO-coated glass substrate having a transparent electrically conductive layer of e.g. ITO formed on the surface of a glass substrate.

A bottom emission type organic photoelectronic element provided with the above-mentioned transparent electrode may, for example, be one having a layer structure which comprises sequentially from the bottom, an anode made of ITO-coated glass substrate/a hole injection layer of the present invention/a hole transport layer/a light emitting layer/an electron transport layer/an electron injection layer/an Al cathode as a counter electrode.

In the layer structure illustrated in FIG. 1, with respect to the relationship of suitable refractive indexes of the respective layers, it is preferred to minimize the refractive index of the charge injection layer adjacent to the electrode from the viewpoint of the suppression of the plasmon absorption, by making the refractive index difference between adjacent layers to be small in order to reduce the film guided light.

By arranging the respective layers with the above suitable refractive indexes, it becomes easy to increase the light extraction efficiency from the organic photoelectronic element illustrated in FIG. 1 to a level of from about 20 to 30%.

The method for producing an organic photoelectronic element of the present invention is not particularly limited so long as it is a method having a step of forming the above-described charge injection layer of the present invention as its charge injection layer, and it is possible to apply a conventional method. The method for producing the charge injection layer of the present invention is as described above, and either a dry coating method or a wet coating method may be applied.

The organic photoelectronic element of the present invention preferably constitutes an optical resonator structure (microcavity) to resonate light between the anode 1 and a cathode 7. Between the anode 1 and the cathode 7, light generated in the light emitting layer 4 is repeatedly reflected, and light having a wavelength that matches the optical path length between the anode 1 and the cathode 7 will be amplified by resonance. On the other hand, light of a wavelength that does not match the optical path length between the anode 1 and the cathode 7 will be attenuated.

The optical path length between the anode 1 and the cathode 7 is set to be, for example, an integral multiple of the center wavelength of the light generated in the light emitting layer 4. In that case, the light emitted by the light emitting layer 4 will be amplified as it is closer to the center wavelength, or will be attenuated and emitted to the outside of the organic EL element 10 as it is far from the center wavelength. In this manner, light emitted from the organic photoelectronic element 10, becomes to be one, of which the half value width of the emission spectrum is narrow, and the color purity is improved.

The microcavity structure utilizes resonance by fixed end reflections at both ends being the cathode and the anode. Therefore, it is possible to form a desired microcavity structure in a case where the "optical path length from the light emission position to the anode is an integer multiple of ¼ of the wavelength λ of the desired light emitted to the outside of the element" and the "optical path length from the light emission position to the cathode is an integer multiple of ¼ of the wavelength λ of the desired light emitted to the outside of the element".

Advantageous Effect

As described above, the charge injection layer of the present invention contains a fluorinated polymer and a semiconductor material, and has a refractive index in the wavelength range of from 450 nm to 800 nm of at most 1.60. The charge injection layer of the present invention having this construction can have a refractive index lower than the refractive index of the charge injection layer of a single-component system consisting of only a semiconductor material. As a result, the light extraction efficiency of the organic photoelectronic element will be improved.

Example of Implementation of the Present Invention

Hereinafter, the implementation of the present invention will be described in detail, but the present invention is not limited by the following description.

The measurements of the refractive index, molecular weight, intrinsic viscosity and saturated vapor pressure of a fluorinated copolymer synthesized in this example, were carried out in accordance with the following description.

Method for Measurement of Refractive Index of Fluorinated Polymer

Measured in accordance with JIS K 7142.

Method for Measurement of Weight Average Molecular Weight of Fluorinated Polymer The weight average molecular weight of a fluorinated polymer was measured by gel permeation chromatography (GPC). First, PMMA standard samples having known molecular weights were measured by using GPC, and from the elution time and molecular weight of the peak top, a calibration curve was prepared. Then, the fluorinated polymer was measured, and Mw and Mn were obtained from the calibration curve. As the mobile phase solvent, a mixed solvent of 1,1,1,2,3,4,4,5,5,5-decafluoro-3-methoxy-2-(trifluoromethyl)pentane/hexafluoroisopropyl alcohol (volume ratio: 85/15) was used.

Method for Measurement of Intrinsic Viscosity [η] of Fluorinated Polymer

The intrinsic viscosity [η] of a fluorinated polymer was measured at a measurement temperature of 30° C. by Ubbelohde viscometer (manufactured by Shibata Scientific Technology Ltd.: viscometer Ubbelohde) by using ASAHIKLIN (registered trademark) AC2000 (manufactured by Asahi Glass Company, Limited) as the solvent.

Method for Measurement of Evaporation Rate and Saturated Vapor Pressure of Fluorinated Polymer Using a vacuum differential thermal balance (manufactured by ADVANCE RIKO, Inc.: VPE-9000), the evaporation rate and saturated vapor pressure at 300° C. were measured.

50 mg of a fluorinated polymer was charged to a cell with an inner diameter of 7 mm, and under a vacuum degree of $1 \times 10^{-3}$ Pa, the temperature was raised at a rate of 2° C. per minute, whereby the evaporation rate $g/m^2sec$ at 300° C. was measured. For the calculation of the saturation vapor pressure, the evaporation rate and Mw obtained by the above-mentioned GPC measurement, were used.

The respective measurements relating to a charge injection layer prepared in the implementation of the present invention, and the evaluations of characteristics of an element prepared in this example were carried out in accordance with the following description.

Method for Measurement of Refractive Index of Charge Injection Layer

Using a multi incidence angle spectroscopic ellipsometry (manufactured by J.A. Woollam Co., Inc.: M-2000U), a film on the silicon substrate was measured by changing the incident angle of light by 5 degrees each time in the range of from 45 to 75 degrees. At each angle, ψ and Δ being ellipsometric parameters were measured at about 1.6 nm intervals in the wavelength range of from 450 to 800 nm. Using the above measurement data, the dielectric function of the organic semiconductor was subjected to fitting analysis by Cauchy model to obtain the refractive index and extinction coefficient of the charge injection layer to light of each wavelength.

Evaluation of J-V Characteristics of Element for Evaluation of Electrical Conductivity By Source Meter (manufactured by Keithley: Keithley (registered trademark) 2401), the electric current flowing in the element for evaluation of electrical conductivity was measured at every voltage, while applying a voltage by using the ITO (indium tin oxide) side as the anode, and the aluminum side as the cathode.

Abbreviations of the monomer, solvent and polymerization initiator used in the preparation of the following fluorinated polymer, are as follows.

BVE: perfluoro(3-butenyl vinyl ether)
1H-PFH: 1,1,1,2,2,3,3,4,4,5,5,6,6-tridecafluorohexane
IPP: diisopropyl peroxydicarbonate Synthesis of Fluorinated Polymer A 30 g of BVE, 30 g of 1 H-PFH, 0.5 g of methanol and 0.44 g of IPP were put in a glass reactor having an inner volume of 50 ml. After replacing inside of the system with high purity nitrogen gas, polymerization was conducted at 40° C. for 24 hours. The obtained solution was subjected to solvent removal under conditions of 666 Pa (absolute pressure) and 50° C. to obtain 28 g of a fluorinated polymer. The intrinsic viscosity [η] of the obtained fluorinated polymer was 0.04 dl/g.

Then, by the method described in paragraph [0040] of JP-A-H11-152310, the obtained fluorinated polymer was subjected to substitution of unstable terminal groups for —$CF_3$ groups by fluorine gas to obtain fluorinated polymer A.

Of the obtained fluorinated polymer A, the refractive index to light having a wavelength of 600 nm was 1.34, and the intrinsic viscosity [η] was 0.04 dl/g. Of the fluorinated polymer A, Mw was 9,000, Mn was 6,000, Mw/Mn was 1.5, the saturated vapor pressure at 300° C. was 0.002 Pa, and the evaporation rate at 300° C. was 0.08 g/$m^2$sec.

EXAMPLES 1 TO 3 AND COMPARATIVE EXAMPLES 1 TO 3

Verification of Effect by Optical Calculation

In order to verify such an effect that light extraction efficiency can be improved as a fluorinated polymer becomes to have a low refractive index by containing a charge injection layer (hole injection layer 2), simulation was made by using Setfos4.6 (manufactured by Cybernet Systems Co., Ltd.).

Optical Calculation in Top Emission Type Organic EL Element

Glass (thickness: 1 mm) as the substrate, Ag (thickness: 100 nm) as the anode 1, the following one as the hole injection layer 2, α-NPD (thickness: 60 nm) as the hole transport layer 3, Ir(ppy)$_3$ (light emitting guest) and CBP (thickness: 20 nm) (light emitting host) as the light emitting layer 4, Alq$_3$ as the electron transport layer 5, LiF (thickness: 1 nm) as the electron injection layer 6, and Ag (thickness: 10 nm) as the cathode 7, were sequentially laminated to obtain a top emission type organic EL element having a laminate structure 1 as shown in FIG. 1, whereby the optical calculation was carried out.

In Examples 1 to 3, as the hole injection layer 2, a low refractive index hole injection layer (hole injection layer having a refractive index at a wavelength of 550 nm of 1.56) was used. The film thickness in Examples 1 to 3 was set to be 10 nm, 35 nm, and 60 nm, respectively.

On the other hand, in Comparative Examples 1 to 3, as the hole injection layer 2, a HAT-CN hole injection layer (hole injection layer having a refractive index at a wavelength of 550 nm of 1.79) was used. The film thickness in Comparative Examples 1 to 3 was set to be 10 nm, 35 nm, and 60 nm, respectively.

Figure 2:
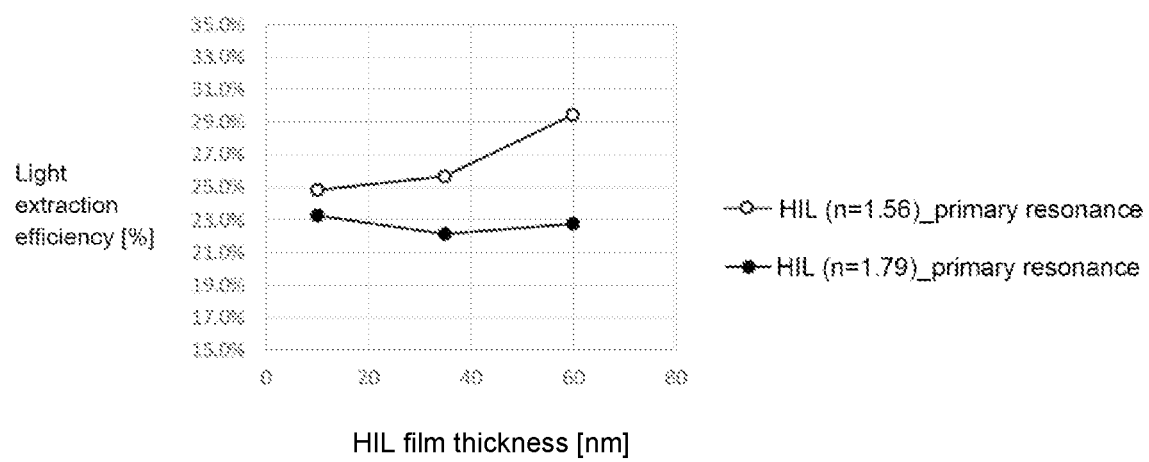
FIG. 2 shows the analysis results of optical calculation (primary resonance) in a top emission type organic EL element.
Figure 3:
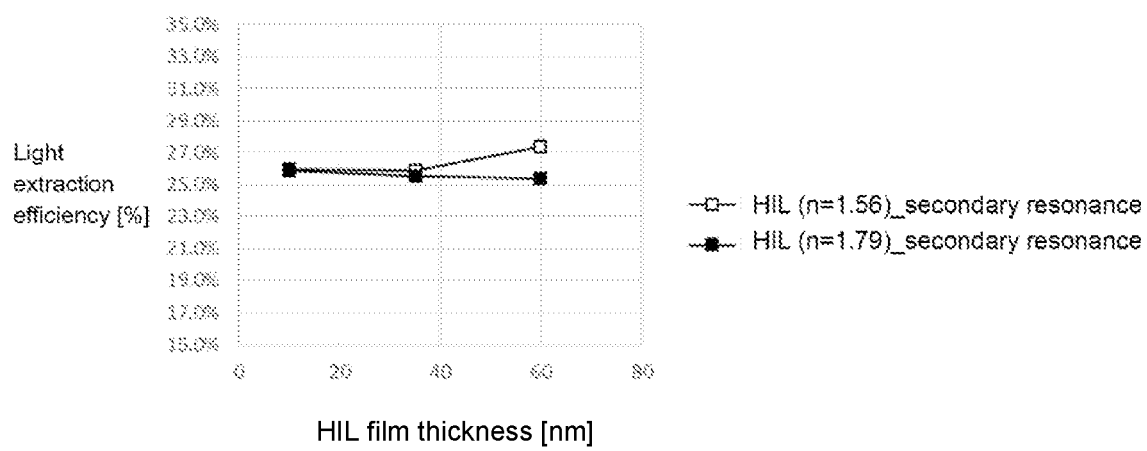
FIG. 3 shows the analysis results of optical calculation (secondary resonance) in a top emission type organic EL element.

Under such three conditions that the film thickness of the hole injection layer 2 was 10 nm, 35 nm and 60 nm, the film thickness of the electron transport layer 5 was swept at 30 nm intervals in the range of from 50 nm to 250 nm, and the film thickness of the hole transport layer 3 was swept at 30 nm intervals in the range of from 10 nm to 300 nm, whereby conditions under which the light extraction efficiency becomes to be maximum on the thin film side (primary resonance) and thick film side (secondary resonance) of the hole transport layer 3 were calculated. The results of the analysis are shown in Table 1 and FIGS. 2 and 3.

TABLE 1

|  | Hole injection layer | | Hole transport layer | Electron transport layer | Light extraction efficiency |
|---|---|---|---|---|---|
|  | Refractive index @ 550 nm | Thickness nm | (Best value) Thickness nm | (Best value) Thickness nm | (Maximum value) |
| Example 1 | 1.56 | 10 | 40 | 140 | 24.9% |
|  |  |  | 190 | 140 | 26.0% |
| Example 2 | 1.56 | 35 | 10 | 140 | 25.7% |
|  |  |  | 190 | 140 | 25.9% |

TABLE 1-continued

|  | Hole injection layer | | Hole transport layer | Electron transport layer | Light extraction efficiency |
|---|---|---|---|---|---|
|  | Refractive index @ 550 nm | Thickness nm | (Best value) Thickness nm | (Best value) Thickness nm | (Maximum value) |
| Example 3 | 1.56 | 60 | 10 | 140 | 29.5% |
|  |  |  | 160 | 140 | 27.4% |
| Comparative Example 1 | 1.79 | 10 | 40 | 140 | 23.3% |
|  |  |  | 190 | 140 | 25.9% |
| Comparative Example 2 | 1.79 | 35 | 40 | 110 | 22.1% |
|  |  |  | 160 | 170 | 25.5% |
| Comparative Example 3 | 1.79 | 60 | 10 | 140 | 22.8% |
|  |  |  | 160 | 140 | 25.4% |

When the light extraction efficiency of the primary resonance and the light extraction efficiency of the second resonance were compared respectively at each thickness (10 nm, 35 nm, 60 nm) of the hole injection layer 2, it was confirmed that the light extraction efficiency was higher in Examples 1 to 3 in which the refractive index of the hole injection layer 2 was low, than in Comparative Examples 1 to 3. Particularly, in the construction for the primary resonance in Example 3 (construction such that the low refractive index hole injection layer is thick, and the hole transport layer is thin), remarkable improvement of the light extraction efficiency was confirmed.

EXAMPLES 4 TO 6 AND COMPARATIVE EXAMPLES 4 TO 6

Optical Calculation in Bottom Emission Type Organic EL Element

Glass (thickness: 1 mm) as the substrate, ITO (thickness: 100 nm) as the anode 1, the following one as the hole injection layer 2, α-NPD (thickness: 30 nm) as the hole transport layer 3, Ir(ppy)₃ (light emitting guest) and CBP (thickness: 30 nm) (light emitting host) as the light emitting layer 4, TPBi as the electron transport layer 5, LiF (thickness: 0.8 nm) as the electron injection layer 6, and Al (thickness: 100 nm) as the cathode 7 were sequentially laminated to obtain a bottom emission type organic EL element having a laminate structure 1 as shown in FIG. 1, whereby the optical calculation was carried out.

In Examples 4 to 6, using the same settings as in Examples 1 to 3, a low refractive index hole injection layer (hole injection layer having a refractive index at a wavelength of 550 nm of 1.56) was used as the hole injection layer 2. The film thickness in Examples 4 to 6 was set to be 10 nm, 35 nm, and 60 nm, respectively.

On the other hand, in Comparative Examples 4 to 6, using the same settings as in Comparative Example 1 to 3, a HAT-CN hole injection layer (hole injection layer having a refractive index at a wavelength of 550 nm of 1.79) was used as the hole injection layer 2. The film thickness in Comparative Examples 4 to 6 was set to be 10 nm, 35 nm, and 60 nm, respectively.

Figure 4:
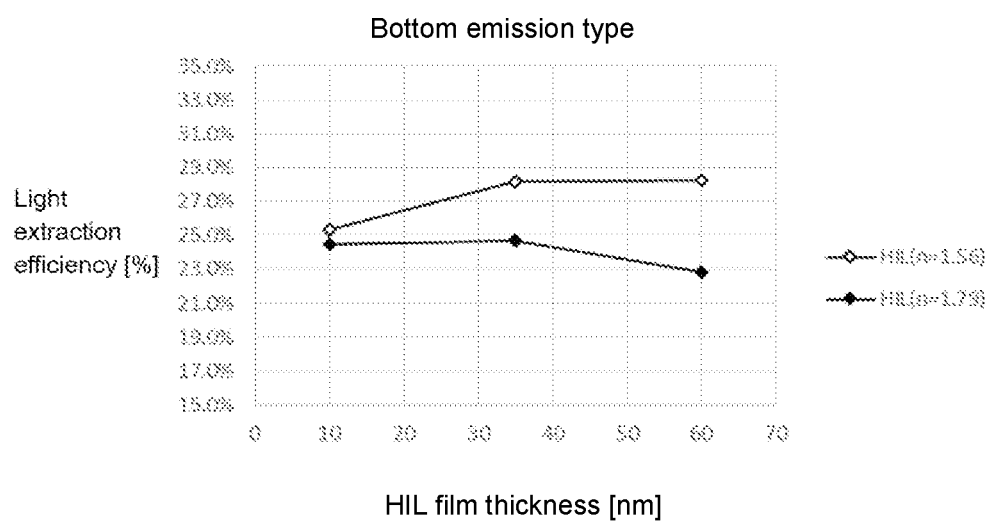
FIG. 4 shows the analysis results of optical calculation in a bottom emission type organic EL element.

Under such three conditions that the film thickness of the hole injection layer 2 is 10 nm, 35 nm, and 60 nm, the film thickness of the electron transport layer 5 and the film thickness of the hole transport layer 3 were swept at 5 nm intervals in the range of from 10 nm to 100 nm, whereby conditions under which the light extraction efficiency becomes to be maximum, were calculated. The results of the analysis are shown in Table 2 and FIG. 4.

TABLE 2

|  | Hole injection layer | | Hole transport layer | Electron transport layer | Light extraction efficiency |
|---|---|---|---|---|---|
|  | Refractive index @ 550 nm | Thickness nm | (Best value) Thickness nm | (Best value) Thickness nm | (Maximum value) |
| Example 4 | 1.56 | 10 | 25 | 55 | 25.3% |
| Example 5 | 1.56 | 35 | 10 | 55 | 28.2% |
| Example 6 | 1.56 | 60 | 10 | 45 | 28.3% |
| Comparative Example 4 | 1.79 | 10 | 30 | 55 | 24.5% |
| Comparative Example 5 | 1.79 | 35 | 10 | 55 | 24.7% |
| Comparative Example 6 | 1.79 | 60 | 10 | 45 | 22.9% |

When the light extraction efficiency was compared in each thickness of the hole injection layer 2 (10 nm, 35 nm, 60 nm), it was confirmed that the light extraction efficiency was higher in Examples 4 to 6 in which the refractive index of the hole injection layer 2 was low, than in Comparative Examples 4 to 6. Particularly, in the construction in Examples 5 and 6 in which the low refractive index hole injection layer was thick, and the hole transport layer was thin, remarkable improvement of the light extraction efficiency was confirmed.

EXAMPLE 7

Preparation of Element for Evaluation of Electrical Conductivity

As a substrate for preparing an organic EL element for evaluation, a glass substrate having ITO (indium tin oxide) film-deposited in a strip shape with a width of 2 mm was used. The substrate was subjected to ultrasonic cleaning with a neutral detergent, acetone and isopropyl alcohol, and further boil-washed in isopropyl alcohol, whereupon deposits on the ITO film surface were removed by ozone treatment. This substrate was placed in a vacuum vapor deposition machine and evacuated to a pressure of at most $10^{-4}$ Pa, whereupon HAT-CN and fluorinated polymer A were subjected to resistance heating and co-vapor deposition in the vacuum deposition machine so that the volume ratio of HAT-CN to the fluorinated polymer A would be 50:50, thereby to film-deposit them on the substrate in a thickness of 10 nm as a hole injection layer. The total vapor deposition rate of the two materials was set to be 0.2 nm/s. Thereafter, α-NPD was subjected to resistance heating in the vacuum vapor deposition machine, to laminate a hole transport layer in a thickness of 100 nm at a vapor deposition rate of 0.1 nm/s. Further, aluminum was vapor-deposited by resistance heating in a strip shape with a width of 2 mm, to obtain an element for evaluation of electrical conductivity. The element area becomes to be 2 mm×2 mm having ITO with a width of 2 mm and aluminum with a width of 2 mm crossed.

COMPARATIVE EXAMPLE 7

A charge injection layer and an element for evaluation of electrical conductivity were prepared in the same manner as in Example 7 except that without using fluorinated polymer A, only HAT-CN was vapor-deposited in 10 nm on the substrate, as a hole injection layer.

Figure 5:
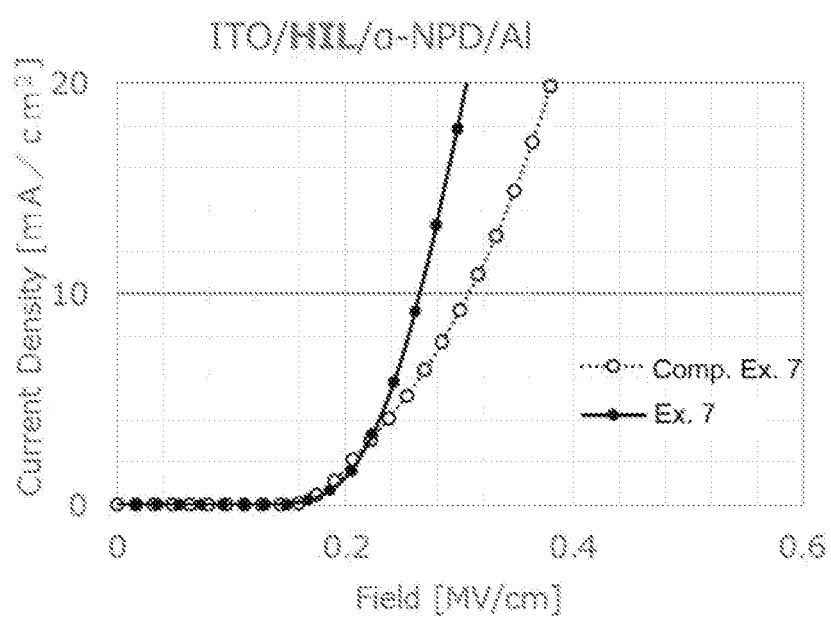
FIG. 5 shows the J-V characteristics of elements for evaluation of electrical conductivity in Example 7 and Comparative Example 7.

The J-V characteristics of the elements for evaluation of electrical conductivity in Example 7 and Comparative Example 7 are shown in FIG. 5. The field value (value obtained by dividing the voltage by the thickness) at which the current density becomes to be 10 mA/cm² was 0.31 MV/cm in Comparative Example 7, but was low-voltaged at a level of 0.27 MV/cm in Example 7. Surprisingly, by mixing the fluorinated polymer in the charge injection layer, the effect to improve the electrical conductivity was confirmed.

EXAMPLE 8

Preparation of Element for Measurement of Refractive Index

A silicon substrate cut into an about 2 cm square was subjected to ultrasonic cleaning with a neutral detergent, acetone and isopropanol, respectively, and further boil-washed in isopropanol, whereupon deposits on the substrate surface were removed by ozone treatment. This substrate was placed in a vacuum vapor deposition machine and evacuated to a pressure of at most $10^{-4}$ Pa, whereupon HAT-CN and fluorinated polymer A were subjected to resistance heating and co-vapor deposition in the vacuum vapor deposition machine so that their volume ratio would be 50:50, thereby to prepare a hole injection layer with a thickness of about 100 nm on the substrate. The refractive index to light having a wavelength of 600 nm of the obtained hole injection layer was 1.55.

COMPARATIVE EXAMPLE 8

A charge injection layer and an element for evaluation of electrical conductivity were prepared in the same manner as in Example 8, except that without using fluorinated polymer A, only HAT-CN was vapor-deposited in 100 nm on the substrate. The refractive index to light having a wavelength of 600 nm of the obtained hole injection layer was 1.78.

From Example 8 and Comparative Example 8, it was confirmed that by co-vapor depositing HAT-CN and the fluorinated polymer A so that their volume ratio would be 50:50, the refractive index decreased from 1.78 to 1.55.

As described above, by using the charge injection layer of this embodiment, it is possible to improve the light extraction efficiency of the organic EL device, and further the hole conductivity will also be improved, whereby low power consumption or long useful life is expected, such being industrially very beneficial.

INDUSTRIAL APPLICABILITY

The charge injection layer of the present invention and an element provided therewith can be suitably used in an operation panel or an information display panel of various electronic devices, and also can be suitably used in various organic photoelectronic devices wherein the refractive index affects the device characteristics.

This application is a continuation of PCT Application No. PCT/JP2018/031237, filed on Aug. 23, 2018, which is based upon and claims the benefit of priority from Japanese Patent Application No. 2017-161640 filed on Aug. 24, 2017. The contents of those applications are incorporated herein by reference in their entireties.

REFERENCE SYMBOLS

1: Anode
2: Hole injection layer
3: Hole transport layer
4: Light emitting layer
5: Electron transport layer
6: Electron injection layer
7: Cathode
10: Organic photoelectronic element

What is claimed is:

1. A charge injection layer containing a fluorinated polymer and a semiconductor material, and having a refractive index in the wavelength range of from 450 nm to 800 nm of at most 1.60.

2. The charge injection layer according to claim 1, wherein the volume ratio represented by (the content of the fluorinated polymer):(the content of the semiconductor material) is from 70:30 to 5:95.

3. The charge injection layer according to claim 1, which contains a dopant.

4. The charge injection layer according to claim 3, wherein the content proportion of the fluorinated polymer is from 30 to 70 vol %, to the total of the fluorinated polymer, the semiconductor material and the dopant.

5. The charge injection layer according to claim 3, wherein the content proportion of the dopant is from 10 to 200 parts by mol to 100 parts by mol of the entire mass of the semiconductor material.

6. The charge injection layer according to claim 1, wherein the charge injection layer is a physical vapor deposition layer.

7. The charge injection layer according to claim 1, wherein the refractive index in the wavelength range of from 450 nm to 800 nm, of the fluorinated polymer, is at most 1.5.

8. The charge injection layer according to claim 1, wherein the evaporation rate at 300° C. in a vacuum degree of at most $1\times10^{-3}$ Pa, of the fluorinated polymer, is at least 0.01 g/m²sec.

9. The charge injection layer according to claim 1, wherein the fluorinated polymer is a polymer which does not have an aliphatic ring and has units derived from a fluoroolefin, in the main chain, or a polymer which has an aliphatic ring structure in the main chain.

10. The charge injection layer according to claim 1, wherein the fluorinated polymer is a perfluoropolymer having an aliphatic ring structure in the main chain.

11. The charge injection layer according to claim 1, wherein the weight average molecular weight of the fluorinated polymer is from 1,500 to 50,000.

12. An organic photoelectronic element comprising an anode, a cathode provided to face the anode, a light emitting layer provided between the anode and the cathode, and a hole injection layer provided on the light emitting layer side of the anode, wherein the hole injection layer is a charge injection layer as defined in claim 1.

13. The organic photoelectronic element according to claim 12, which is provided with a hole transport layer between the light emitting layer and the hole injection layer, and the ratio of the thickness of the hole injection layer to the thickness of the hole transport layer is from 1:2 to 30:1.

14. An organic photoelectronic element comprising an anode, a cathode provided to face the anode, a light emitting layer provided between the anode and the cathode, and an electron injection layer provided on the light emitting layer side of the cathode, wherein the electron injection layer is a charge injection layer as defined in claim 1.

15. The organic photoelectronic element according to claim 14, which is provided with an electron transport layer between the light emitting layer and the electron injection layer, and the ratio of the thickness of the electron injection layer to the thickness of the electron transport layer is from 1:2 to 30:1.

16. The organic photoelectronic element according to claim 12, wherein the perfluoropolymer is polyperfluoro(3-butenyl vinyl ether).

17. The organic photoelectronic element according to claim 16, wherein the intrinsic viscosity of the polyperfluoro (3-butenyl vinyl ether) is from 0.01 to 0.14 dl/g.

18. A method for producing a charge injection layer as defined in claim 1, which comprises a step of co-vapor depositing the fluorinated polymer and the semiconductor material on the anode or cathode.

19. A method for producing a charge injection layer as defined in claim 1, which comprises a step of applying a liquid composition comprising the fluorinated polymer and the semiconductor material, on the anode or cathode.

20. A method for producing an organic photoelectronic element, which comprises a step of forming a charge injection layer by the method as defined in claim 18.

21. A method for producing an organic photoelectronic element, which comprises a step of forming a charge injection layer by the method as defined in claim 19.

\* \* \* \* \*